(12) United States Patent
Moden

(10) Patent No.: US 7,215,015 B2
(45) Date of Patent: May 8, 2007

(54) IMAGING SYSTEM

(75) Inventor: Walter Moden, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 210 days.

(21) Appl. No.: 10/899,258

(22) Filed: Jul. 26, 2004

(65) Prior Publication Data

US 2005/0003579 A1 Jan. 6, 2005

Related U.S. Application Data

(62) Division of application No. 10/408,183, filed on Apr. 7, 2003, now Pat. No. 6,917,090.

(51) Int. Cl.
*H01L 23/02* (2006.01)
(52) U.S. Cl. .................. 257/680; 257/778; 257/682; 257/693; 257/698
(58) Field of Classification Search ............. 257/680, 257/778, 682, 693, 698
See application file for complete search history.

(56) References Cited

U.S. PATENT DOCUMENTS

| | | |
|---|---|---|
| 5,327,325 A | 7/1994 | Nicewarner, Jr. |
| 5,963,429 A | 10/1999 | Chen |
| 5,973,391 A | 10/1999 | Bischoff et al. |
| 6,013,946 A | 1/2000 | Lee et al. |
| 6,048,755 A | 4/2000 | Jiang et al. |
| 6,057,175 A | 5/2000 | Milla et al. |
| 6,084,308 A | 7/2000 | Kelkar et al. |
| 6,091,140 A | 7/2000 | Toh et al. |
| 6,109,369 A | 8/2000 | Crumly et al. |
| 6,144,507 A | 11/2000 | Hashimoto |
| 6,198,087 B1 | 3/2001 | Boon |
| 6,228,687 B1 | 5/2001 | Akram et al. |
| 6,233,184 B1 | 5/2001 | Barth et al. |
| 6,262,513 B1 | 7/2001 | Furukawa et al. |
| 6,303,981 B1 | 10/2001 | Moden |
| 6,310,390 B1 | 10/2001 | Moden |
| 6,320,178 B1 | 11/2001 | Miller et al. |
| 6,326,242 B1 | 12/2001 | Brooks et al. |
| 6,329,222 B1 | 12/2001 | Corisis et al. |
| 6,351,028 B1 | 2/2002 | Akram |

(Continued)

FOREIGN PATENT DOCUMENTS

JP 1999-320075 * 4/1999

*Primary Examiner*—Long Pham
(74) *Attorney, Agent, or Firm*—Stephen A. Gratton

(57) ABSTRACT

A semiconductor package includes a substrate, and a semiconductor die flip chip mounted to the substrate. The package also includes substrate circuitry on a circuit side of the substrate, die circuitry on a back side of the die, terminal contacts on the die circuitry, bonded connections between the substrate circuitry and the die circuitry, and an encapsulant on the bonded connections and edges of the die. The die can include an image sensor on the circuit side configured to receive electromagnetic radiation transmitted through the substrate. A method for fabricating the package includes the step of providing a wafer with multiple dice, forming the die circuitry on the dice, and simulating the wafer into individual dice. The method also includes the steps of providing a substrate panel with multiple substrates, forming the substrate circuitry on the substrates, flip chip bonding the dice to the substrates, forming bonded connections between the dice and the substrates, forming the terminal contacts on the die circuitry, and singulating the panel into separate components.

6 Claims, 7 Drawing Sheets

U.S. PATENT DOCUMENTS

| | | |
|---|---|---|
| 6,396,091 B2 | 5/2002 | Ewer |
| 6,407,381 B1 | 6/2002 | Glenn et al. |
| 6,407,451 B2 | 6/2002 | Akram et al. |
| 6,408,510 B1 | 6/2002 | Hembree |
| 6,410,989 B1 | 6/2002 | Shivkumar et al. |
| 6,429,509 B1 | 8/2002 | Hsuan |
| 6,437,984 B1 | 8/2002 | Chiu et al. |
| 6,437,990 B1 | 8/2002 | Degani et al. |
| 6,441,481 B1 | 8/2002 | Karpman |
| 6,441,503 B1 | 8/2002 | Webster |
| 6,479,326 B1 | 11/2002 | Corisis et al. |
| 6,486,546 B2 | 11/2002 | Moden et al. |
| 6,486,554 B2 | 11/2002 | Johnson |
| 6,492,728 B2 | 12/2002 | Kinsman et al. |
| 6,503,776 B2 | 1/2003 | Pai et al. |
| 6,504,572 B2 | 1/2003 | Kramer et al. |
| 6,506,625 B1 | 1/2003 | Moden |
| 6,506,628 B2 | 1/2003 | Jiang et al. |
| 6,507,114 B2 | 1/2003 | Hui et al. |
| 6,507,118 B1 | 1/2003 | Schueller |
| 6,511,863 B2 | 1/2003 | Farnworth et al. |
| 6,512,290 B2 | 1/2003 | Kinsman et al. |
| 6,512,302 B2 | 1/2003 | Mess et al. |
| 6,512,303 B2 | 1/2003 | Moden |
| 6,552,427 B2 | 4/2003 | Moden |
| 6,582,992 B2 | 6/2003 | Poo et al. |
| 6,589,810 B1 | 7/2003 | Moden |
| 6,611,052 B2 | 8/2003 | Poo et al. |
| 6,638,792 B2 | 10/2003 | Hui et al. |
| 6,660,558 B1 | 12/2003 | Bolken et al. |
| 6,661,084 B1 | 12/2003 | Peterson et al. |
| 6,700,210 B1 | 3/2004 | Smith |
| 6,740,960 B1 | 5/2004 | Farnworth et al. |
| 6,753,482 B1 | 6/2004 | Schoenfeld et al. |
| 6,917,090 B2 | 7/2005 | Moden |

\* cited by examiner

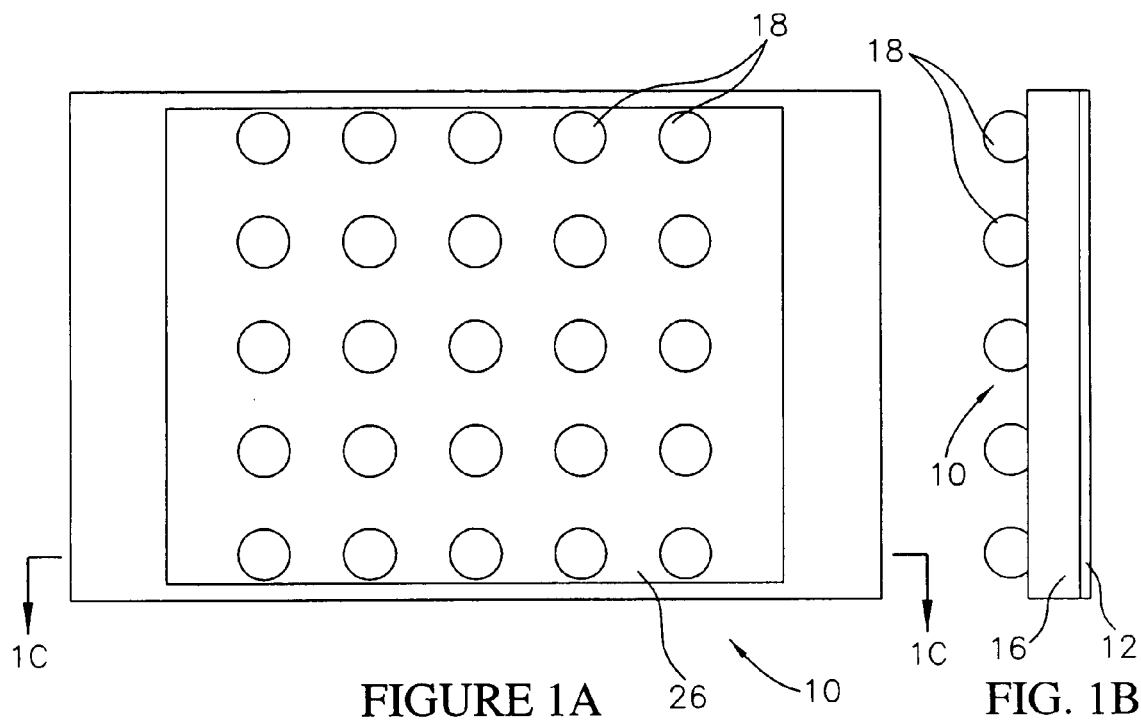
FIGURE 1A
FIG. 1B
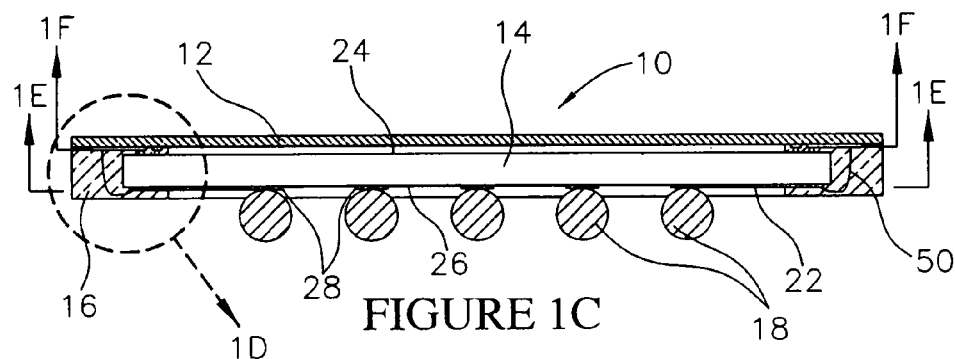
FIGURE 1C
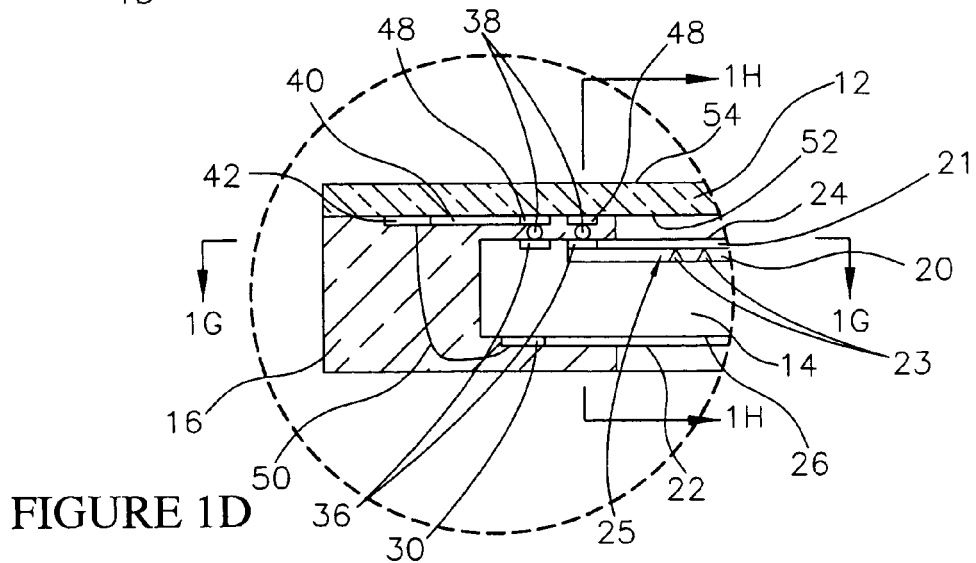
FIGURE 1D

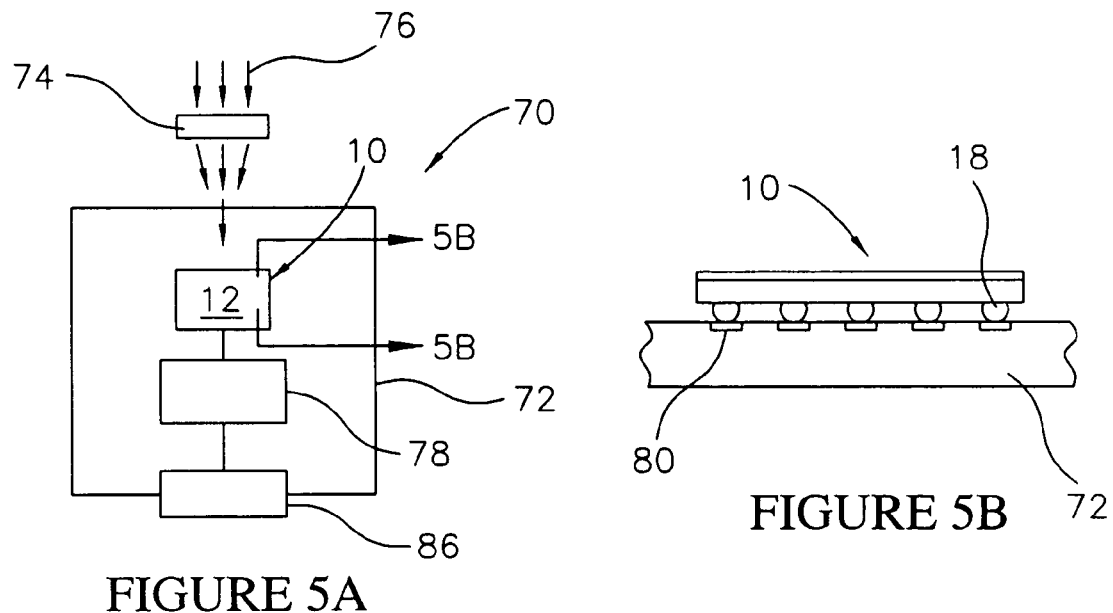
FIGURE 5A
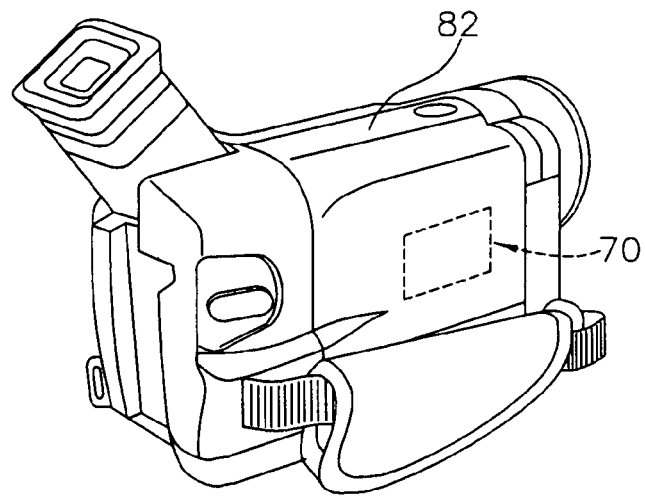
FIGURE 5B
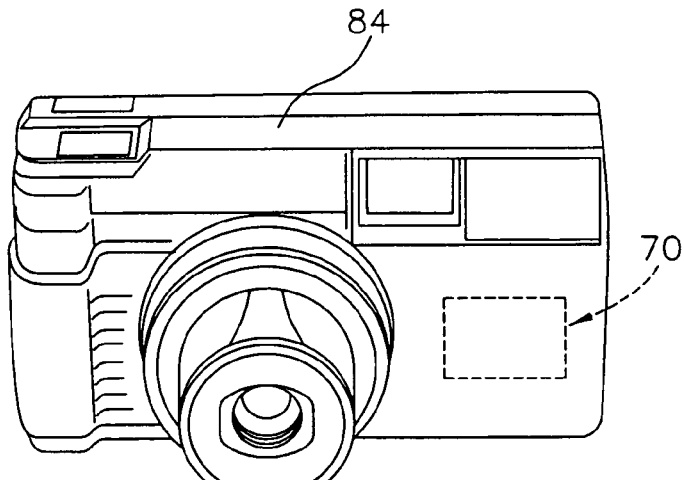
FIGURE 6
FIGURE 7

IMAGING SYSTEM

CROSS REFERENCE TO RELATED APPLICATIONS

This application is a division of Ser. No. 10/408,183, filed Apr. 7, 2003, U.S. Pat. No. 6,917,090 B2.

This application is related to Ser. No. 10/847,413, filed May 17, 2004, U.S. Pat. No. 6,969632 B2.

FIELD OF THE INVENTION

This invention relates generally to semiconductor manufacture and packaging. More particularly, this invention relates to a chip scale image sensor semiconductor package, to a method for fabricating the package, and to systems incorporating the package.

BACKGROUND OF THE INVENTION

As the semiconductor industry advances, manufacturers are developing different packaging methods that make semiconductor components smaller, faster and more reliable. For example, chip scale packages (CSP) have a peripheral outline that is about the same as the dice contained in the packages. In addition, chip scale packages are designed for flip chip bonding to a supporting substrate, such as a package substrate, a module substrate or a printed circuit board (PCB). With flip chip bonding, bumps, pins or other terminal contacts on the package, are bonded to mating contacts on the supporting substrate. The bonded terminal contacts provide the physical and electrical connections between the package and the supporting substrate.

One important design consideration for chip scale packages is the signal transmission system between the die contacts on the dice, and the terminal contacts for the package. Some prior art chip scale packages incorporate relatively complicated electrical interconnections between the die contacts and the terminal contacts, such as beam leads, mechanical clips and edge contacts on the dice. These electrical interconnections can be unreliable and expensive to manufacture. It would be desirable for a chip scale package to have an internal signal transmission system that is reliable and capable of volume manufacture at a low cost.

One particular type of semiconductor package includes a die configured as a CMOS image sensor. With a CMOS image sensor, an active area of the die includes a photo diode, a photo transistor or a similar device configured as a light detecting element. The output of the light detecting element is an analog signal whose magnitude is approximately proportional to the amount of light received by the element. Recently, image sensor dice are being developed for use in mainstream consumer products, such as digital cameras, camcorders, and scanners. As with conventional semiconductor devices, it would be desirable to package a CMOS image sensor die in a chip scale package.

The present invention is directed to a chip scale image sensor semiconductor package, to a method for fabricating the package, and to systems incorporating the package.

SUMMARY OF THE INVENTION

In accordance with the present invention, an improved chip scale semiconductor package, a method for fabricating the package, and systems incorporating the package are provided.

The semiconductor package includes a substrate, and a semiconductor die flip chip mounted to the substrate. In the illustrative embodiment the substrate comprises a transparent material, such as glass, and the semiconductor die includes an image sensor, configured to receive electromagnetic radiation, such as light, transmitted through the substrate.

The substrate includes substrate circuitry on a circuit side thereof that includes substrate contacts for flip chip bonding the die, and substrate bonding contacts in electrical communication with the substrate contacts. The die includes bumped die contacts on a circuit side thereof bonded to the substrate contacts. The die also includes die circuitry on a back side thereof. The die circuitry includes terminal contacts in an area array, such as a ball grid array (BGA), and die bonding contacts on the back side in electrical communication with the terminal contacts. The die also includes integrated circuits, such as an image sensor, in electrical communication with the bumped die contacts.

The package also includes a plurality of bonded connections, such as wires or TAB leads, bonded to the substrate bonding contacts and to the die bonding contacts. The bonded connections, the substrate bonding contacts, the die bonding contacts, and the bumped die contacts form an internal signal transmission system for the package. The package also includes an encapsulant, such as a curable polymer, which encapsulates the bonded connections, and seals the edges of the die on the substrate.

A method for fabricating the package includes the steps of providing a wafer containing multiple dice, forming die circuitry on the back sides of the dice, forming the bumped contacts on the circuit sides of the dice, and singulating the wafer into individual dice. In addition, the method includes the steps of providing a panel containing multiple substrates, forming substrate circuitry on the substrates, and flip chip bonding the dice to the substrate circuitry. The method also includes the steps of wire bonding or TAB bonding the die circuitry to the substrate circuitry, forming the encapsulants on the wires and edges of the dice, forming the terminal contacts on the die circuitry, and singulating the panel into separate packages.

An imaging system includes a circuit board, one or more of the packages on the circuit board, and an image processor in electrical communication with the packages. The imaging system can be incorporated in light processing systems such as digital camcorders and digital cameras.

BRIEF DESCRIPTION OF THE DRAWINGS

FIG. 1A is an enlarged schematic bottom view of a semiconductor package constructed in accordance with the invention and containing a CMOS image sensor die;

FIG. 1B is an enlarged schematic side elevation view of the package;

FIG. 1C is an enlarged schematic cross sectional view of the package taken along section line 1C—1C of FIG. 1A;

FIG. 1D is an enlarged schematic cross sectional view of the package taken along line 1D of FIG. 1C;

FIG. 5A is a schematic view of an imaging system incorporating a semiconductor package constructed in accordance with the invention;

FIG. 5B is a schematic cross sectional view taken along section line 5B—5B of FIG. 5A illustrating mounting of the package in the imaging system;

FIG. 6 is a schematic view of a digital camcorder incorporating the imaging system; and FIG. 7 is a schematic view of a digital camera incorporating the imaging system.

DETAILED DESCRIPTION OF THE PREFERRED EMBODIMENTS

Figure 1E:
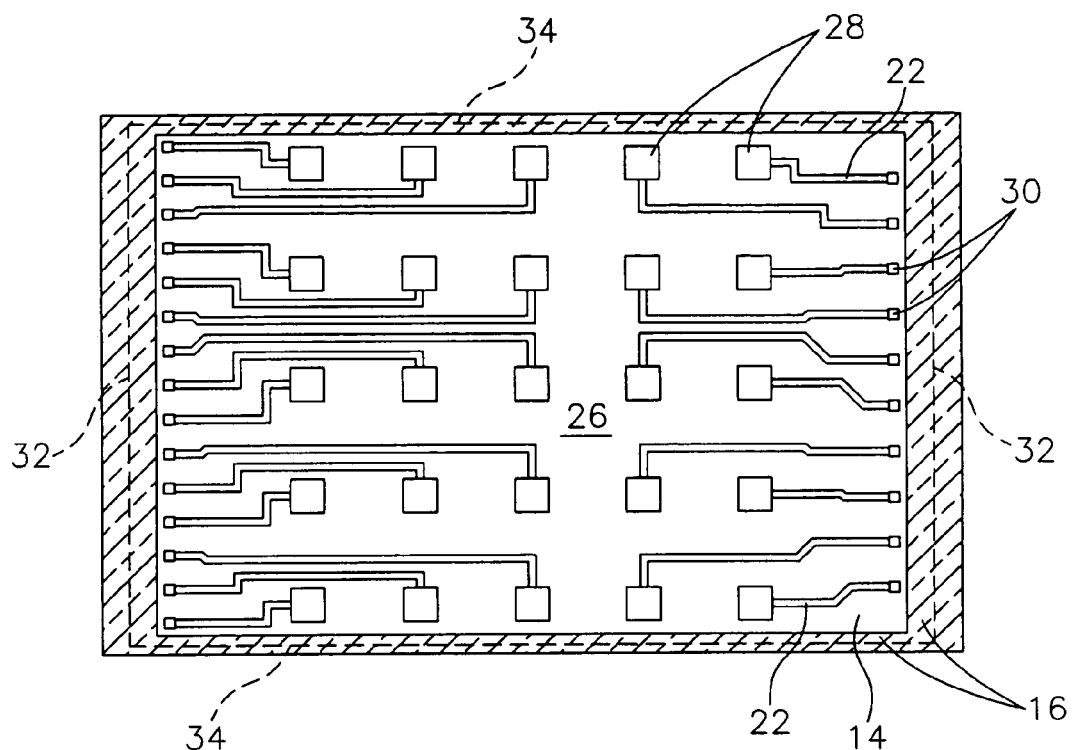
FIG. 1E is an enlarged schematic cross sectional view of the package taken along section line 1E—1E of FIG. 1C illustrating a back side circuit pattern on the die.

Referring to FIGS. 1A–1C, a semiconductor package 10 constructed in accordance with the invention is illustrated. In the illustrative embodiment the package 10 comprises a flip chip on glass (FCIPOG) image sensor semiconductor package.

In addition, the package 10 has a peripheral outline (footprint) that is slightly larger than, but about the same, as the peripheral outline (footprint) of the semiconductor die 14. The package 10 can thus be considered a chip scale package (CSP). In the illustrative embodiment, the package 10 and the die 14 have generally rectangular peripheral outlines, but other polygonal outlines, such as square or hexagonal can also be utilized.

The package 10 includes a transparent substrate 12, a semiconductor die 14 flip chip mounted to the substrate 12, and an encapsulant 16 on the substrate 12 and on the edges of the die 14. In the illustrative embodiment, the substrate 12 comprises a glass that is transparent to light, or other electromagnetic radiation, and the semiconductor die 14 comprises an image sensor die. In addition to providing structural support and rigidity for the package 10, the substrate also functions as a lens for the die 14.

The package 10 also includes an array of electrically conductive terminal contacts 18 configured for signal transmission to and from the package 10. In the illustrative embodiment the terminal contacts 18 comprise metal bumps or balls. However, the terminal contacts 18 can also comprise pins, polymer bumps, spring contacts or any terminal contact known in the art. Also in the illustrative embodiment, there are twenty-five terminal contacts 18, arranged in a five×five grid array. However, this arrangement is merely exemplary, and the terminal contacts 18 can be arranged in any dense area array, such as a ball grid array (BGA), or a fine ball grid array (FBGA).

As shown in FIG. 1D, the die 14 has a circuit side 24, an image sensor 25 on the circuit side 24, and a back side 26. The image sensor 25 includes an active area 20 having an array of light detecting elements 23, such as photo diodes, or photo transistors, each of which is capable of responding to light, or other electromagnetic radiation, impinging thereon. The circuit side 24 of the die 14 can also include other integrated circuits, and semiconductor devices (not shown) which are included in, or implement the operation of, the image sensor 25. For example, the integrated circuits and semiconductor devices can include analog to digital converter circuits, fault detection circuits and memory circuits.

As also shown in FIG. 1D, a transparent window 21 on the die 14 protects and electrically insulates the active area 20 of the image sensor 25, but permits light, or other electromagnetic radiation, to impinge on the light detecting elements 23. Further, the circuit side 24 of the die 14 faces the substrate 12, such that light, or other electromagnetic radiation, can be transmitted through the substrate 12, and through the transparent window 21 to the light detecting elements 23. The transparent window 21 can comprise an optically transparent material, such as borosilicate glass (BPSG), which can be formed with a required geometry using semiconductor circuit fabrication techniques, such as deposition and patterning. However, for some applications, the transparent window 21 can be eliminated, as the substrate 12 also protects and electrically insulates the active area 20.

As shown in FIG. 1E, the back side 26 of the die 14 includes a pattern of terminal contact pads 28, which provide bonding sites for the terminal contacts 18 (FIG. 1A). The terminal contact pads 28 are arranged in the same pattern as the terminal contacts 18 (i.e., 5×5 grid array). The terminal contact pads 28 can comprise a bondable metal, such as Cu, Au or Al, on which the terminal contacts 18 can be easily deposited or bonded. Further, the terminal contact pads 28 can comprise a single layer of metal or a multi layer stack (e.g., under bump metallization layer, non-oxidizing bonding layer).

As also shown in FIG. 1E, the die 14 includes a pattern of back side conductors 22 formed on the back side 26 thereof in electrical communication with the terminal contact pads 28. The back side conductors 22 can comprise a highly conductive metal capable of deposition using semiconductor circuit fabrication techniques, such as electroless deposition, CVD, electrolytic deposition, sputtering, etching, screen printing or stenciling. Suitable metals include aluminum, chromium, titanium, nickel, iridium, copper, gold, tungsten, silver, platinum, palladium, tantalum, molybdenum and alloys of these metals. In addition, the back side conductors 22 can comprise a single layer of metal, or a multi layered stack of metals.

As also shown in FIG. 1E, the die 14 also includes a pattern of die bonding contacts 30 formed on the back side 26, and along opposing lateral edges 32 of the die 14. The die bonding contacts 30 can comprise a bondable metal such as Cu, Au or Al, on which wire bonds or TAB bonds can be easily formed. The die bonding contacts 30 are in electrical communication with the back side conductors 22 and with the terminal contact pads 28. In addition, the die bonding contacts 30 are wire bonded, or alternately TAB bonded (tape automated bonded) to mating substrate bonding contacts 42 (FIG. 1D) on the substrate 12.

Figure 1F:
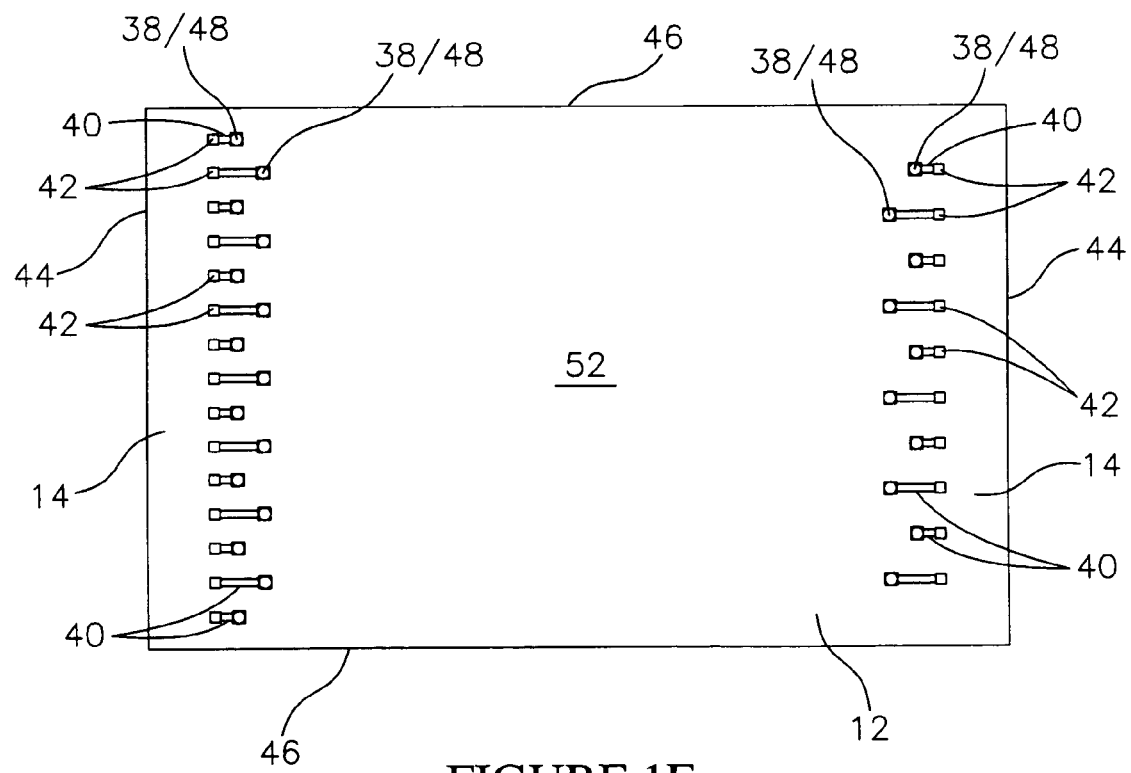
FIG. 1F is an enlarged schematic cross sectional view of the package taken along section line 1F—1F of FIG. 1C illustrating a circuit pattern on a substrate of the package.
Figure 1G:
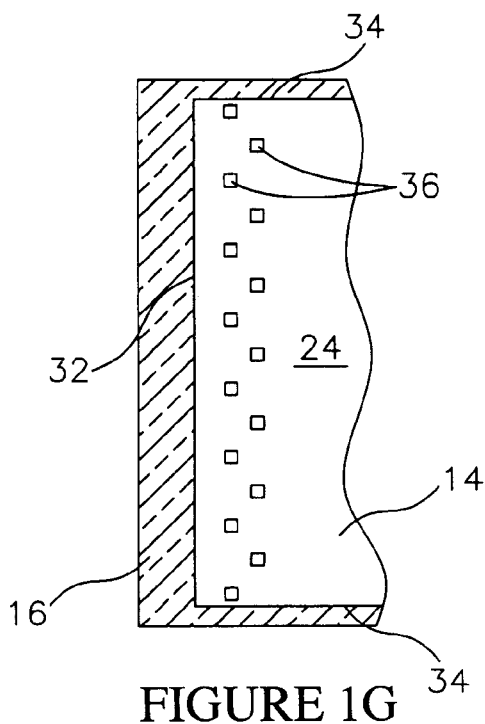
FIG. 1G is an enlarged schematic partial cross sectional view taken along section line 1G—1G of FIG. 1D illustrating die contacts on the die.

As shown in FIG. 1G, the die 14 also includes a pattern of die contacts 36 formed on the circuit side 24 thereof. The die contacts 36 can comprise the device bond pads, or redistribution pads, in electrical communication with the light detecting elements 23 (FIG. 1D) in the active area 20 (FIG. 1D) of the die 14. In the illustrative embodiment, the die contacts 36 are arranged in two columns of staggered rows along the opposing edges 32 of the die 14. Alternately, the die contacts 36 can be arranged in any pattern or array used in the art.

Figure 1H:
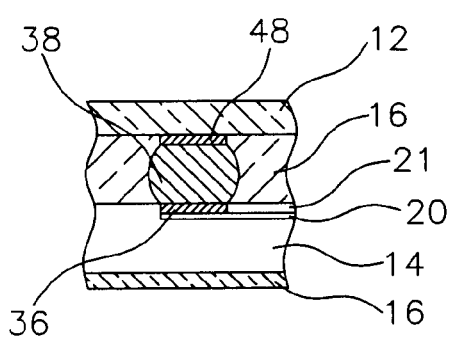
FIG. 1H is an enlarged schematic cross sectional view of the package taken along section line 1H—1H of FIG. 1D illustrating bumped contacts on the die bonded to the substrate.
Figure 1I:
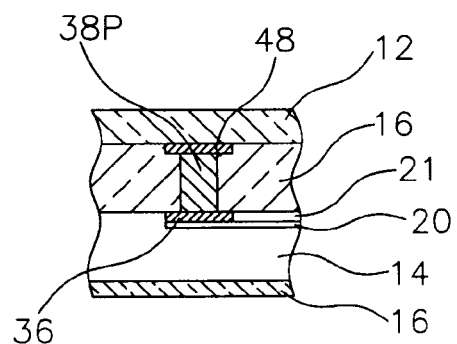
FIG. 1I is an enlarged schematic cross sectional view of the package equivalent to FIG. 1H illustrating alternate embodiment bonded pins between the die and the substrate.
Figure 1J:
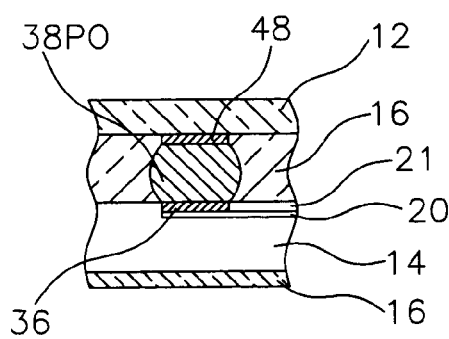
FIG. 1J is an enlarged schematic cross sectional view of the package equivalent to FIG. 1H illustrating alternate embodiment bonded conductive polymer bumps between the die and the substrate.

As shown in FIG. 1H, the die contacts 36 also include bumped contacts 38, configured to flip chip bond the die 14 to the substrate 12. In particular, the bumped contacts 38 on the die 14 are bonded to substrate contacts 48 on the substrate 12. In the embodiment illustrated in FIG. 1H, the bumped contacts 38 comprise solder bumps or balls, reflow bonded to the substrate contacts 48. As shown in FIG. 1I, alternate embodiment die contacts 38P comprise metal pins 38P which are welded, soldered or brazed to the substrate contacts 48. As shown in FIG. 1J, alternate embodiment die contacts 38PO comprise conductive polymer bumps cured in place on the substrate contacts 48.

Figure 1K:
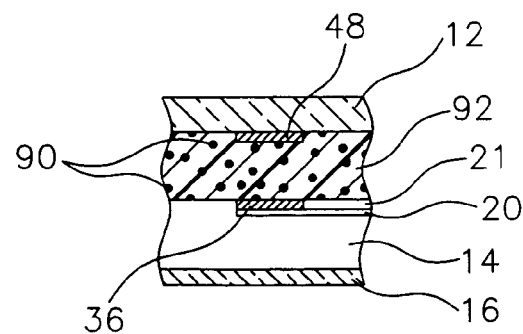
FIG. 1K is an enlarged schematic cross sectional view of the package equivalent to FIG. 1H illustrating an alternate embodiment z-axis conductive film between the die and the substrate.

As shown in FIG. 1K, a z-axis conductive film 92 can be used to electrically connect the substrate contacts 48 to the die contacts 36. The z-axis conductive film 92 can include conductive particles 90 configured to provide electrical conductivity in the z-direction, while a base material of the conductive film 92 provides electrical isolation in the x and y directions. In this case the encapsulant 16 can be configured to leave the substrate contacts 48 and the die contacts 36 exposed, such that the conductive particles 90 can make the electrical connections.

As shown in FIG. 1F, the substrate 12 includes the substrate contacts 48, which are formed on the circuit side 52 of the substrate 12, in a pattern that matches the pattern of the die contacts 36 (FIG. 1D) on the circuit side 24 (FIG. 1D) of the die 14 (FIG. 1D). The substrate 12 also includes substrate conductors 40 in electrical communication with the substrate contacts 48. In addition, the substrate 12 includes the substrate bonding contacts 42, which correspond in size and location to the die bonding contacts 30 (FIG. 1E) on the die 14.

As shown in FIG. 1D, bonded connections in the form of wire bonded wires 50 are bonded to the die bonding contacts 30 on the back side 26 of the die 14, and to the substrate bonding contacts 42 on the circuit side 52 of the substrate 12. In addition, the wires 50, and the associated wire bonds at both ends, along with the die bonding contacts 30, and the substrate bonding contacts 42, are encapsulated in the encapsulant 16. Alternately, rather than being wire bonded wires 50 the bonded connections can comprise tape leads 50TAB (FIG. 4E) and TAB bonds 88 (FIG. 4E).

Figure 2A:
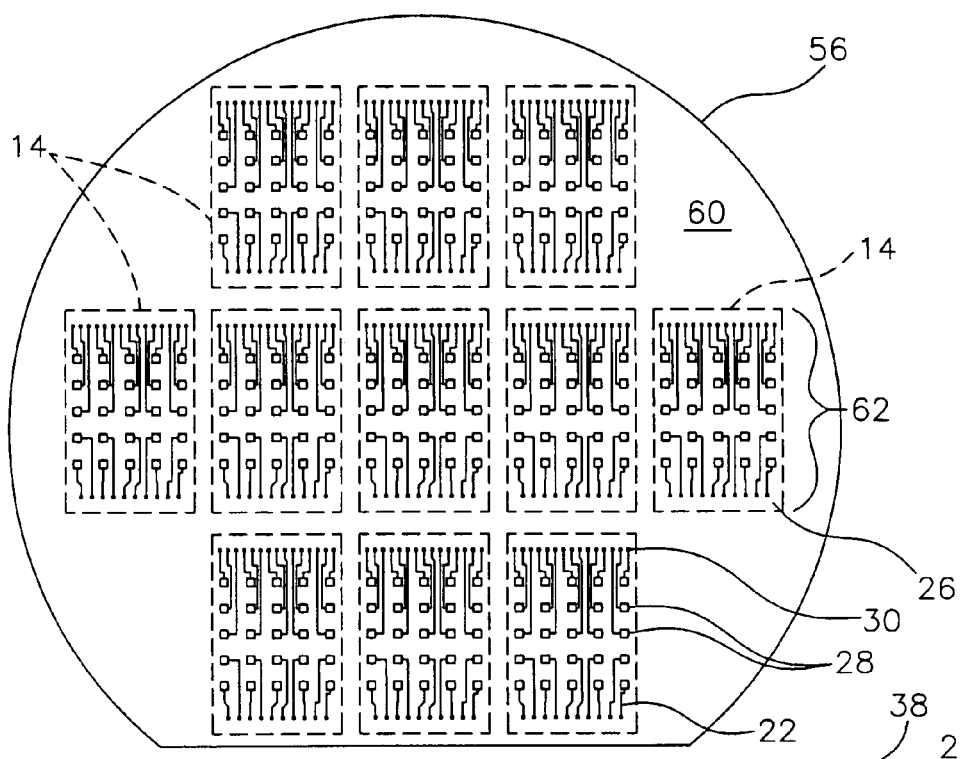
FIG. 2A is a schematic bottom view of a semiconductor wafer containing CMOS image sensor dice used in the fabrication of the package of FIG. 1A and illustrating back side circuitry on the dice.
Figure 2C:
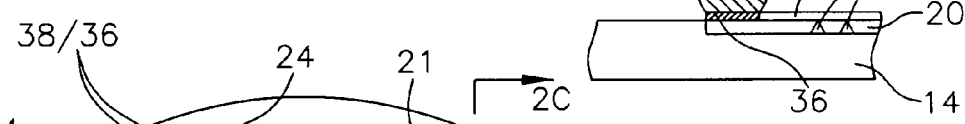
FIG. 2C is an enlarged schematic cross sectional view taken along section line 2C—2C of FIG. 2B illustrating bumped contacts on the dice.
Figure 2B:
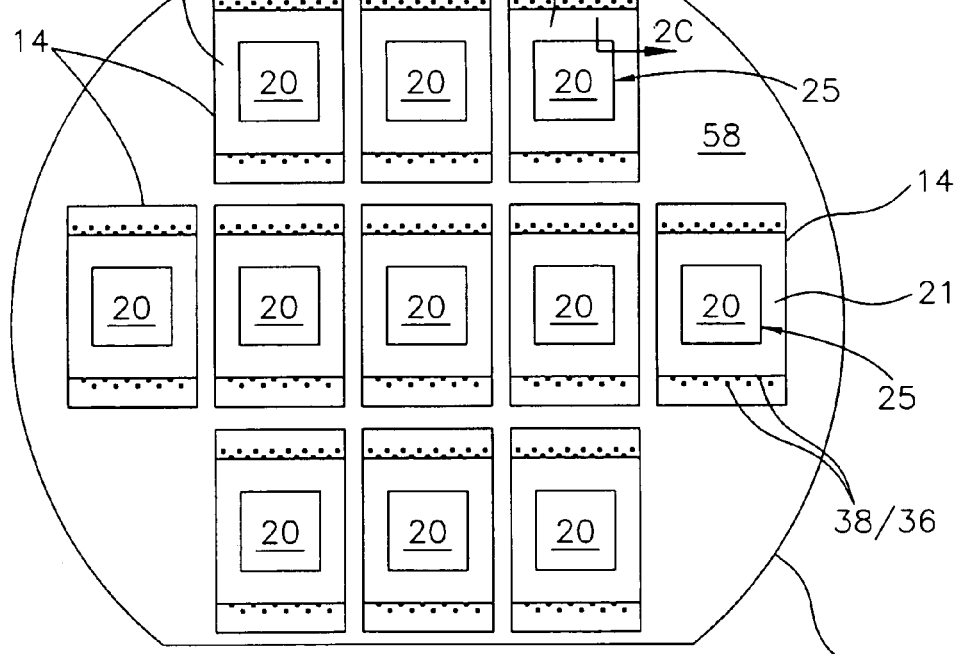
FIG. 2B is a schematic plan view of the semiconductor wafer illustrating active areas and bumped contacts on the dice in electrical communication with the active areas.

Referring to FIGS. 2A–2C, steps in a method for fabricating the package 10 (FIG. 1A) are illustrated. Initially, a semiconductor wafer 56 containing a plurality of semiconductor dice 14 can be provided. FIG. 2A shows a back side 60 of the wafer 56, and FIG. 2B shows a circuit side 58 of the wafer 56.

As shown in FIG. 2A, a back side die circuitry 62 can be formed on the back side 26 of each die 14. Each back side die circuitry 62 includes the area array of terminal contact pads 28, the pattern of back side conductors 22 in electrical communication with the terminal contact pads 28, and the die bonding contacts 30 in electrical communication with the back side conductors 22. The back side die circuitry 62 can be formed using a subtractive process (e.g., etching) or an additive process (e.g., sputtering, or a combination of sputtering and plating) as is known in the art. In addition, the terminal contact pads 28, the back side conductors 22, and the die bonding contacts 30 can comprise different layers of materials.

Alternately, the back side die circuitry 62TAB (FIG. 4E) can comprise a multi layer tape decal, such as TAB tape, or ASMAT available from Nitto Denko Corporation of Japan. In this case, the back side die circuitry 62TAB (FIG. 4E) can be attached to the back side 60 of the singulated die 14 using a suitable adhesive. In addition, the back side die circuitry 62TAB (FIG. 4E) can include tape leads 50TAB (FIG. 4E) in electrical communication with the back side conductors 22, configured to form TAB bonds 88 (FIG. 4E) with the wire bonding pads 42 (FIG. 1D) on the substrate 12 in place of the wire bonded wires 50.

As shown in FIGS. 2B and 2C, the wafer 56 can be provided with a selected number of semiconductor dice 14 in a selected pattern. Each die 14 includes an image sensor 25 having an active area 20 which contains the light detecting elements 23, as well as other integrated circuits and semiconductor devices arranged in a desired circuit configuration. Further, each die can include a window 21 which protects the active area 20 and the light detecting elements 23. The window 21 can comprise a layer of material that is transparent to the electromagnetic radiation of interest, such as a layer of optically transparent borosilicate glass. In addition, each die 14 includes the die contacts 36 which can comprise the device bond pads, or redistribution pads, in electrical communication with the image sensor 25. All of these elements of the dice 14 can be constructed using materials and techniques that are known in the art.

As also shown in FIGS. 2B and 2C, the bumped contacts 38 can be formed on the die contacts 36. This step can be performed by bonding, or depositing, the bumped contacts 38 on the die contacts 36. For example, the bumped contacts 38 can comprise metal bumps deposited using a suitable deposition process, such as stenciling and reflow of a solder alloy. The bumped contacts 38 can also be formed by electrolytic deposition, by electroless deposition, or by bonding pre-fabricated balls to the die contacts 36. Also, rather than being formed of metal, the bumped contacts 38PO (FIG. 1J) can comprise a conductive polymer material. Still further, the bumped contacts 38P (FIG. 1I) can comprise metal, or metal plated pins.

Following forming of the back side circuitries 62 on the back side 60, and the bumped contacts 38 on the circuit side 58, the wafer 56 can be singulated into the individual dice 14. The singulating step can be performed using techniques that are known in the art such as sawing, scribing, etching or liquid jetting. Following singulation, the individual dice 14 can be held in a dicing tray, or other suitable apparatus awaiting flip chip bonding to the substrate 12.

Figure 3A:
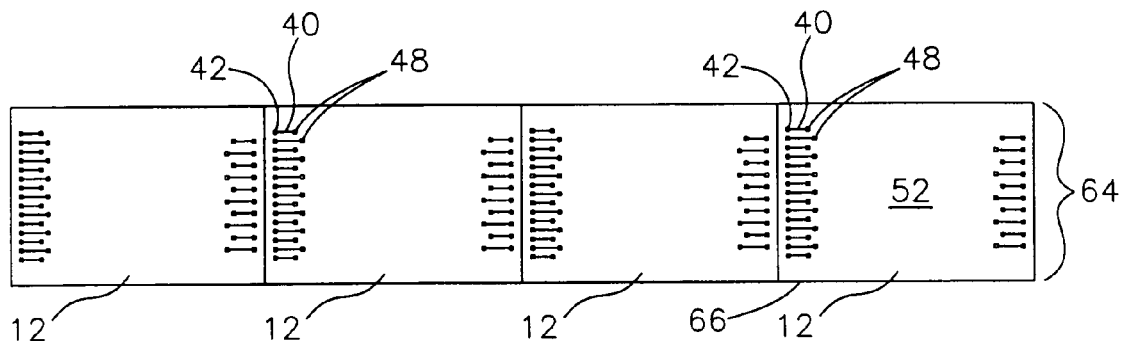
FIGS. 3A–3D are enlarged schematic plan views illustrating steps in the fabrication of the package of FIG. 1A.

Referring to FIGS. 3A–3D and FIGS. 4A–4D, further steps in the method for fabricating the package 10 (FIG. 1A) are illustrated. Initially, as shown in FIG. 3A, a substrate panel 66 which comprises a plurality of substrates 12 is provided. Each substrate 12 is sized to form a single package 10. In the illustrative embodiment, the substrate panel 66 is a strip of four substrates 12. However, the substrate panel 66 can have any convenient shape (e.g., square, wafer) and can include any number of substrates 12. In addition, rather then being performed on multiple substrates 12 at the same time, the fabrication method can be performed on a single substrate 12.

The substrate panel 66 comprises a lens quality glass plate, similar to window glass, but having suitable optical and light transmission qualities for functioning as a lens for image sensor 25 on the die 14. In addition, the substrate panel 66 can have a selected planarity and thickness, with a thickness range of from 0.1 mm to 1 mm being representative. Each substrate 12 on the panel 66 has a generally rectangular peripheral outline (footprint) which corresponds to, but is slightly larger (e.g., 1.2×) than the peripheral outline of the die 14.

As shown in FIG. 3A, a substrate circuitry 64 is formed on the circuit side 52 of each substrate 12. The substrate circuitry 64 includes the substrate bonding contacts 42, the substrate conductors 40, and the substrate contacts 48 configured as previously described and shown in FIG. 1F. In addition, the substrate circuitry 64 is located proximate to the opposing lateral edges of the substrate 12 such that the middle portion of the substrate is unobstructed for light transmission there through to the image sensor 25 (FIG. 1D) on the die 14.

The substrate circuitry 64 can be formed on each substrate 12 using techniques that are known in the art. One suitable technique for forming the substrate circuitry 64 comprises screen printing followed by firing at an elevated temperature. Another suitable technique for forming the substrate circuitry 64 comprises CVD through mask. Yet another suitable technique for forming the substrate circuitry 64 comprises laminating a metal sheet (e.g., copper) to the substrates 12, and then etching the metal sheet through a mask. In any case, the substrate circuitry 64 can also include different layers of metal if desired, to facilitate the function of the elements thereof. Still another technique for forming the substrate circuitry 64 comprises attaching a multi layer tape decal, such as TAB tape, or ASMAT available from Nitto Denko Corporation of Japan to the substrates 12 using a suitable adhesive.

Figure 3B:
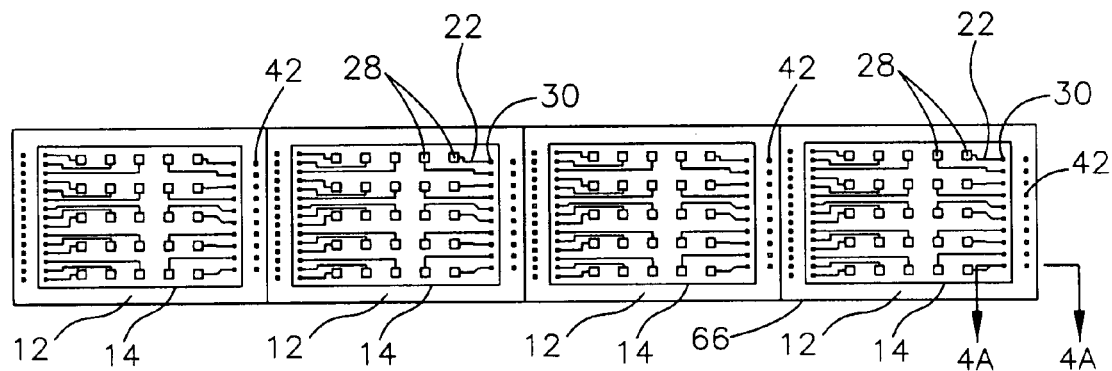
Figure 4A:
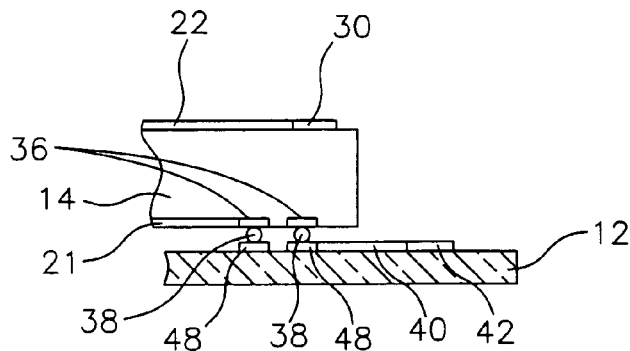
FIG. 4A is an enlarged schematic cross sectional view taken along section line 4A—4A of FIG. 3B illustrating a flip chip bonding step of the fabrication method.

Next, as shown in FIGS. 3B and FIG. 4A, the dice 14 are flip chip bonded circuit sides 24 down, to the circuit sides 52 of the substrates 12. The flip chip bonding step can be performed using automated equipment such as a pick and place mechanism, or an aligner bonder mechanism. During the flip chip bonding step the dice 14 are placed on the substrates 12 with the bumped contacts 38 (FIG. 1H) on the dice 14 in physical contact with the substrate contacts 48 (FIG. 1H) on the substrates 12. The substrate panel 66 with the dice thereon can then be placed in a reflow oven to metallurgically bond the bumped contacts 38 to the substrate contacts 48, substantially as shown in FIG. 1H. Following the flip chip bonding step the substrate bonding contacts 42 remain exposed for wire bonding to the die bonding contacts 30.

Figure 4B:
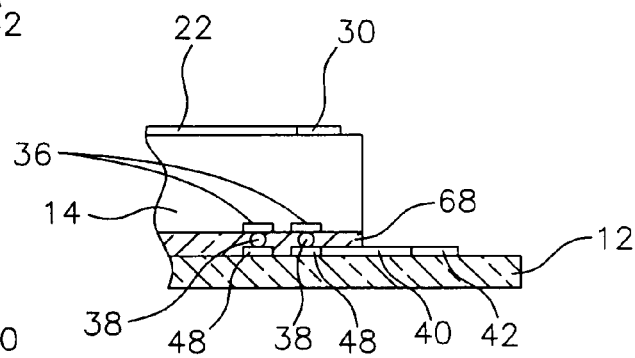
FIG. 4B is an enlarged cross sectional view equivalent to FIG. 4A illustrating an alternate embodiment underfill forming step of the fabrication method.

FIG. 4B illustrates an optional underfill forming step, wherein underfill layers 68 are formed between the dice 14 and the substrates 12. In addition, the windows 21 on the dice 14 have been eliminated, such that the underfill layers 68 protect and seal the active areas 20 (FIG. 2B) and light detecting elements 23 (FIG. 2C). As with the windows 21, the underfill layers 68 must be transparent to the selected wavelength of light at which the light detecting elements 23 operate. The underfill layers 68 can be formed using techniques that are known in the art, such as by deposition on the substrates 12, or on the dice 14, in a viscous state using a conventional deposition apparatus, such as a material dispensing system having a computer controlled nozzle. One suitable system is manufactured by Asymtek of Carlsbad, Calif. Following deposition, the underfill layers 68 can be cured as required. The underfill layers 69 can also comprise a thermoset polymer underfill film, such as an underfill film manufactured by 3M Corporation of Minneapolis, Minn. As another alternative a partial underfill can be employed wherein the underfill layers 68 do not cover selected areas on the dice 14, such as a photo array.

Figure 3C:
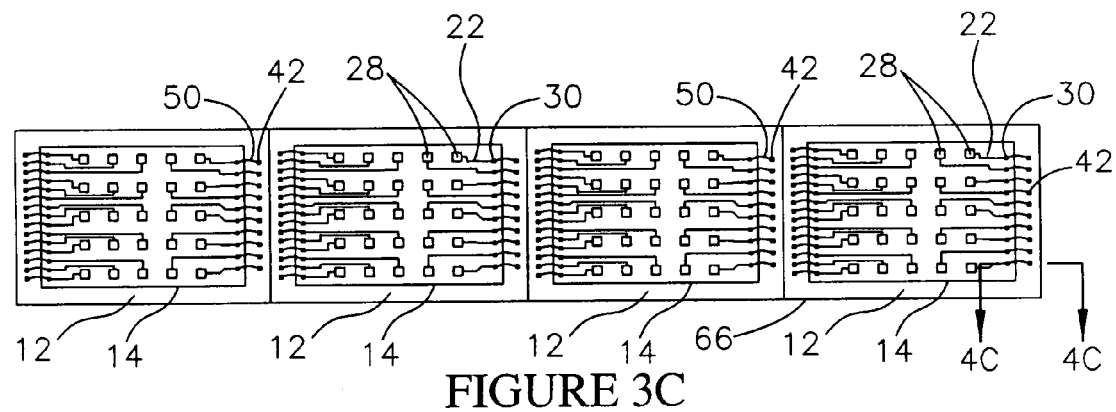
Figure 4C:
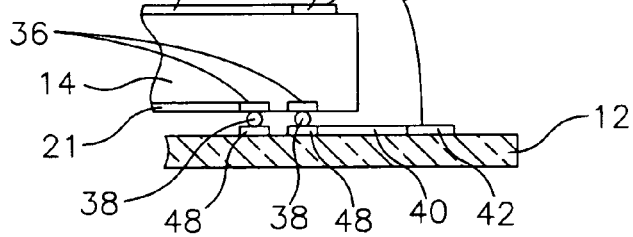
FIG. 4C is an enlarged schematic cross sectional view taken along section line 4C—4C of FIG. 3C illustrating a wire bonding step of the fabrication method.

Next, as shown in FIGS. 3C and FIG. 4C, a bonding step is performed in which bonded connections are formed between the substrate bonding contacts 42 and the die bonding contacts 30. In the illustrative embodiment the bonded connections comprise wires 50, and the bonding step can be performed using a conventional wire bonder apparatus configured to wire bond the wires 50 to the substrate wire bonding pads 48 and to the die bonding contacts 30. Alternately, in the embodiment illustrated in FIG. 4E, the bonded connections comprise the tape leads 50TAB rather than the wire bonded wires 50 (FIG. 4C). In addition, TAB bonds 88 are formed between the substrate bonding contacts 42 and the back side circuitry 62TAB using TAB bonding techniques, such as thermode bonding.

Figure 3D:
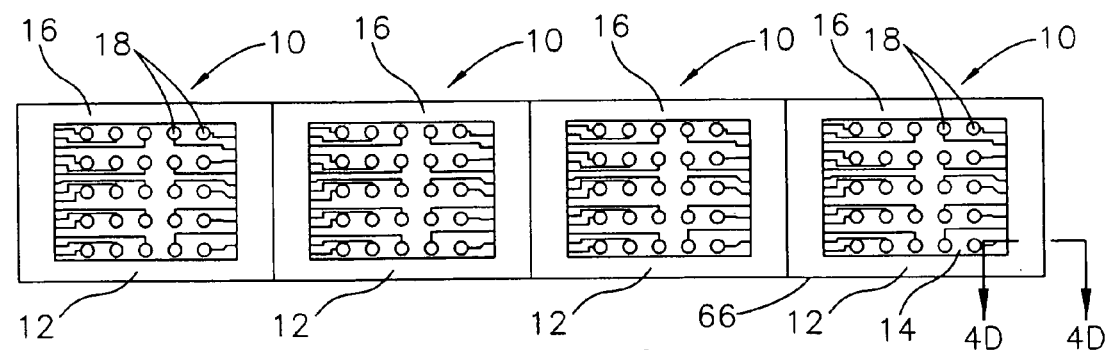
Figure 4D:
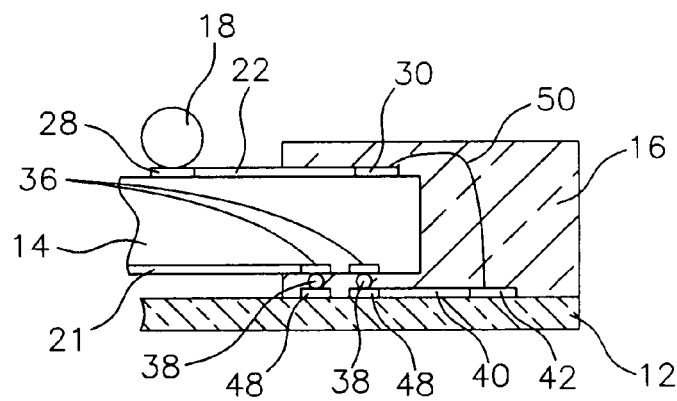
FIG. 4D is an enlarged schematic cross sectional view taken along section line 4D—4D of FIG. 3D illustrating an encapsulating step of the fabrication method.
Figure 4E:
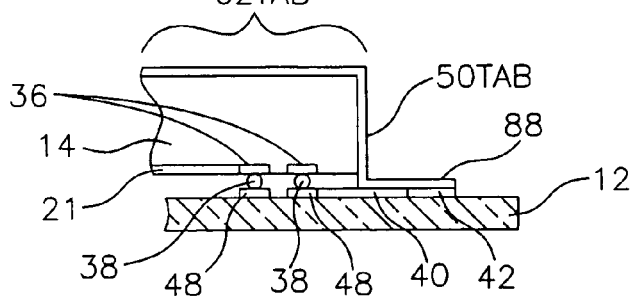
FIG. 4E is an enlarged schematic cross sectional view equivalent to FIG. 4C illustrating an alternate embodiment TAB bonding step.

Next, as shown in FIGS. 3D and 4D, an encapsulant forming step is performed in which the encapsulants 16 are formed on the substrates 12 and edges of the dice 14 to seal the dice 14 on the substrates 12. The encapsulants 16 function to protect the wires 50 and associated wire bonds, and to seal the peripheral edges of the dice 14 on the substrates 12. As such, the encapsulants 16 cover the lateral edges 32 of the dice 14, and the longitudinal edges 34 (FIG. 1E) as well. In addition, each encapsulant 16 has a generally picture frame shape when view from above, and a thickness that is only slightly greater than the thickness of the die 14. Still further each encapsulant 16 has a peripheral outline matching that of the substrate 12.

The encapsulants 16 can comprise a polymer material such as an epoxy, a silicone, a polyimide or a transfer molded underfill compound (MUF). In addition, these polymer materials can include fillers such as silicates configured to reduce the coefficient of thermal expansion (CTE) and adjust the viscosity of the polymer material. One method for forming the encapsulants 16 is by deposition in a viscous state in the manner of a "glob top", using a conventional deposition apparatus, such as a material dispensing system having a computer controlled nozzle. One suitable system is manufactured by Asymtek of Carlsbad, Calif. Following deposition, the underfill layers 68 can be cured as required. The encapsulants 16 can also be transfer molded provided provisions are made to protect the substrates 12 from damage and scratches. Following deposition, the encapsulants 16 can be cured, and if required shaped or planarized using a grinder or other suitable apparatus. As shown in FIG. 1D, each encapsulant 16 has orthogonal, generally planar surfaces.

As also shown in FIG. 3D and FIG. 4D, a terminal contact forming step is performed in which the terminal contacts 18 are formed on the terminal contact pads 28. In the illustrative embodiment, the terminal contacts 18 comprise metal bumps or balls. However, the terminal contacts 18 can also comprise pins, polymer bumps, spring contacts or any terminal contact known in the art. The terminal contacts 18 can be formed using a suitable deposition or bonding process, such as stenciling, screen printing, electroless deposition or electrolytic deposition.

Following the terminal contact forming step, the substrate panel 66 can be singulated into the individual package 10. The singulating step can be performed using a suitable technique such as saw cutting or scribing.

Referring to FIGS. 5A and 5B, an imaging system 70 incorporating one or more packages 10 is illustrated. The imaging system 70 includes a circuit board 72, or other supporting substrate, on which the package 10 is mounted. As shown in FIG. 5B, the package 10 can be flip chip mounted to the circuit board 72 with the terminal contacts 18 thereon bonded to mating board contacts 80 on the circuit board 72. The circuit board 72 includes conductors (not shown) which electrically connect the different elements of the imaging system 70.

The imaging system 70 also includes optics 74 configured to transmit light 76, or other electromagnetic radiation through the substrate 12 of the package 10, and onto the image sensor 25 (FIG. 1D) on the die 14 (FIG. 1D). The imaging system 70 also includes an image processor 78 on the circuit board 72 for processing signals from the package 10, and an interface element 86 for mounting the imaging system 70 in a housing or other device depending on the application.

In general, the imaging system 70 can be utilized in any application requiring light, or other electromagnetic radiation, to be processed into a digital format. For example, in FIG. 6 the imaging system 70 is incorporated into a digital camcorder 82. In FIG. 7, the imaging system is incorporated into a digital camera 84.

Thus the invention provides an improved chip scale image sensor semiconductor package, a method for fabricating the package, and a system incorporating the package. While the invention has been described with reference to certain preferred embodiments, as will be apparent to those skilled in the art, certain changes and modifications can be made without departing from the scope of the invention as defined by the following claims.

What is claimed is:

1. An imaging system comprising:
  a semiconductor package comprising a transparent substrate configured as a support structure and a lens for the package, a substrate circuitry formed on a circuit side of the substrate, a semiconductor die comprising a plurality of die contacts bonded to the substrate circuitry and a die circuitry on a back side thereof having a plurality of terminal contacts, and a plurality of bonded connections between the substrate circuitry and the die circuitry, the substrate circuitry and the bonded connections forming a signal transmission system between the die contacts and the terminal contacts,
  the die comprising an image sensor configured to receive electromagnetic radiation transmitted through the circuit side of the substrate; and
  an optics system configured to transmit the electromagnetic radiation through the circuit side of the substrate to the die.

2. The system of claim 1 further comprising a supporting substrate having a plurality of contacts bonded to the terminal contacts on the die.

3. The system of claim 2 further comprising an image processor on the supporting substrate configured to process signals from the image sensor.

4. An imaging system comprising:
  a semiconductor package comprising a transparent substrate having a substrate circuitry formed on a circuit side thereof, the substrate configured as a support structure for the package having optical and light transmissive qualities for functioning as a lens for the package;
  an image sensor semiconductor die having a plurality of die contacts bonded to the substrate circuitry;
  a die circuitry on a back side of the die comprising a plurality of terminal contacts;
  a plurality of wires bonded to the substrate circuitry and to the die circuitry, the substrate circuitry and the bonded connections forming a signal transmission system between the die contacts and the terminal contacts;
  an optics system configured to direct electromagnetic radiation through the circuit side of the substrate to the die; and
  an image processor in electrical communication with the terminal contacts configured to receive signals from the die.

5. The system of claim 4 wherein the package further includes an encapsulant on the wires sealing the die on the substrate.

6. The system of claim 4 wherein the substrate circuitry comprises substrate contacts bonded to the die contacts and bonding contacts bonded to the wires.

* * * * *